(12) United States Patent
Suzuki et al.

(10) Patent No.: US 7,859,019 B2
(45) Date of Patent: Dec. 28, 2010

(54) NORMALLY-OFF FIELD-EFFECT SEMICONDUCTOR DEVICE

(75) Inventors: Mio Suzuki, Niiza (JP); Akio Iwabuchi, Niiza (JP)

(73) Assignee: Sanken Electric Co., Ltd. (JP)

( * ) Notice: Subject to any disclaimer, the term of this patent is extended or adjusted under 35 U.S.C. 154(b) by 269 days.

(21) Appl. No.: 11/674,051

(22) Filed: Feb. 12, 2007

(65) Prior Publication Data
US 2007/0187718 A1 Aug. 16, 2007

(30) Foreign Application Priority Data
Feb. 13, 2006 (JP) ............... 2006-034946

(51) Int. Cl.
*H01L 29/778* (2006.01)
(52) U.S. Cl. .............. 257/194; 257/E21.407; 257/E21.451
(58) Field of Classification Search ................. 257/194, 257/E21.407, E21.451
See application file for complete search history.

(56) References Cited
U.S. PATENT DOCUMENTS

| | | | | |
|---|---|---|---|---|
| 4,404,475 A | * | 9/1983 | Drori et al. | 327/180 |
| 5,381,028 A | * | 1/1995 | Iwasa | 257/316 |
| 2002/0171096 A1 | * | 11/2002 | Wakejima et al. | 257/280 |
| 2003/0016560 A1 | * | 1/2003 | Kawamura | 365/185.28 |
| 2005/0023555 A1 | * | 2/2005 | Yoshida et al. | 257/192 |
| 2007/0026587 A1 | * | 2/2007 | Briere | 438/159 |

FOREIGN PATENT DOCUMENTS

JP  2005-158889 A  6/2005

* cited by examiner

*Primary Examiner*—A. Sefer
*Assistant Examiner*—Allen L Parker
(74) *Attorney, Agent, or Firm*—Woodcock Washburn LLP (57) ABSTRACT

A HEMT-type field-effect semiconductor device has a main semiconductor region formed on a silicon substrate. The main semiconductor region is a lamination of a buffer layer on the substrate, an electron transit layer on the buffer layer, and an electron supply layer on the electron transit layer. A source and a drain overlie the electron supply layer. A carrier storage layer overlies the electron supply layer via an insulator, and a gate overlies the carrier storage layer via another insulator. Upon application of an initialiser voltage to the gate, the carrier storage layer has stored therein a sufficient amount of carriers to hold the device off even without voltage application to the gate. An initialiser circuit is also disclosed whereby the device is initialized automatically for normally-off operation.

10 Claims, 5 Drawing Sheets

NORMALLY-OFF FIELD-EFFECT SEMICONDUCTOR DEVICE

CROSS REFERENCE TO RELATED APPLICATIONS

This application claims priority to Japanese Patent Application No. 2006-034946, filed Feb. 13, 2006.

BACKGROUND OF THE INVENTION

This invention relates to semiconductor devices, particularly to field-effect semiconductor devices as typified by metal-semiconductor field-effect transistors (MESFETs) and high electron mobility transistors (HEMTs), and more particularly to such field-effect semiconductor devices that can operate normally off. The invention also pertains to a method of initializing such field-effect semiconductor devices for making them ready for operation in normally-off mode.

MESFETs and HEMTs have been both known which are made from semiconducting nitrides belonging to Groups III-V compounds. Japanese Unexamined Patent Publication No. 2005-158889 is hereby cited as dealing with these types of semiconductor devices. The HEMT for example comprises an electron transit layer of undoped GaN grown on a silicon substrate via a buffer layer, an electron supply layer of n-type AlGaN on the electron transit layer, and a source, drain and gate on the electron supply layer. Made from materials with different band gaps, the electron transit layer and electron supply layer provide a heterojunction therebetween. The piezoelectric and spontaneous depolarizations of this heterojunction provide a channel of very low resistance, or of high electron mobility, for current flow between drain and source under the control of a bias voltage applied to the gate. This channel is sometimes referred to as a two-dimensional electron gas layer.

The HEMT of the general construction above was normally on and had to be made off using a negative power supply for causing the gate to gain a negative potential. Use of such a negative power supply made the associated circuitry unnecessary complex and expensive. The normally-on HEMT possessed the additional shortcoming of drawing high input surge current, or inrush current, when it was turned on. An overcurrent protector was therefore needed for the normally-on HEMT. This type of HEMT was rather inconvenient of use for these reasons.

Attempts have been made to render the HEMT normally off by making the AlGaN electron supply layer thinner. A thinner electron supply layer weakens the electric field due to piezoelectric depolarization by the heterojunction between electron supply layer and electron transit layer, resulting in the diminution of electron concentration in the two-dimensional electron gas layer. The two-dimensional electron gas layer disappears just under the gate when a field due to the potential difference, with no built-in potential or bias voltage, between the electron supply layer and, making Schottky contact therewith, the gate acts upon the two-dimensional electron gas layer of reduced electron concentration. The HEMT can thus be held off between drain and base without application of a bias voltage to the gate.

The normally-off HEMT based upon this conventional scheme proved to possess the drawback that, by reason of the thin electron supply layer, the two-dimensional electron supply layer suffered an unnecessary drop in electron concentration at other than right below the gate, too. The result was an inconveniently high drain-source resistance.

It might be contemplated to make the electron supply layer thinner only under the gate. This solution would require selective etching of the electron supply layer, most likely to the impairment of the crystalline structure of the electron supply layer as well as that of the electron transit layer. Selectively etching the electron supply layer without causing these inconveniences was nearly impossible, and the resulting HEMTs were almost certain to suffer in electrical characteristics. As far as the applicant is aware, there seem to be no normally-off HEMTs that are currently available on the market.

There have been consistent demands from electronics and allied industries for not only normally-off two-dimensional-electron-gas HEMTs but normally-off two-dimensional-hole-gas ones too. The HEMTs of both types are very much alike in construction. The same demands have been directed toward MESFETs as well. Analogous in construction with the HEMT, the MESFET typically comprises an n-GaN layer formed on a substrate via a buffer layer, and a source, drain and gate on the n-GaN layer. This device has also been used normally on, and difficulties similar to those with the HEMT have been encountered in making the MESFET normally off.

SUMMARY OF THE INVENTION

It is among the objects of this invention to render field-effect semiconductor devices of the kind defined, capable of normally-off operation without sacrificing their electrical characteristics.

Another object of the invention is to expedite the initialization of such field-effect semiconductor devices for operation in normally-off mode.

Briefly, the present invention may be summarized as a field-effect semiconductor device, such as that of HEMT- or MESFET-type, capable of normally-off operation. Included is a main semiconductor region having a source and a drain on its major surface. A carrier storage, capable of accepting and storing carriers (electrons or holes) therein to such an extent that the source and the drain are held electrically disconnected from each other even without voltage application to the gate, overlies this major surface of the main semiconductor region via first insulating means. A gate overlies the carrier storage via second insulating means.

Carrier-enriched by application of an initializer voltage to the gate, the carrier storage functions to shut off the channel (e.g. two-dimensional electron or hole gas layer in the case of a HEMT) through the main semiconductor region by virtue of the field effect. The carrier-enriched carrier storage is just as effective as a biased gate to block the channel. Consequently, the device can be held off solely by the carrier-enriched carrier storage, with the gate unbiased; that is, the device can be made normally off.

It may be appreciated that the device is made normally off without in any way modifying the design of the main storage region itself, as by making the electron supply layer thinner. As a result, the device has its electrical characteristics totally unaffected by being made normally off according to the invention. A HEMT for instance can have its two-dimensional electron gas channel shut off by the electron-enriched carrier storage even if the electron supply layer is relatively thick. The thick electron supply layer is conducive to enhancement of the electron concentration of the two-dimensional electron gas and hence to a low on-resistance of the HEMT. In the case of a MESFET, too, the semiconductor layer providing the channel can be relatively thick for normally-off operation according to the invention. The thick semiconductor layer also leads to a low on-resistance of the MESFET.

The invention also provides an initializer circuit whereby the device is initialized by having a sufficient amount of carriers introduced into the carrier storage for normally-off operation. In a preferred embodiment the initializer circuit comprises an initializer pulse generator for applying between the gate and the source a required number of initializer pulses in order to cause carriers to be sufficiently stored in the carrier storage, and means for ascertaining, after application of each initializer pulse, whether the carrier storage has stored therein a sufficient amount of carriers to hold the source and the drain electrically disconnected from each other even without voltage application to the gate.

The ascertaining means may comprise: (a) a first threshold pulse generator for applying, after each initializer pulse, between the gate and the source a first threshold pulse representative of one limit of a target range in which the threshold of the device is desired to be upon completion of initialization; (b) a second threshold pulse generator for applying, after the first threshold pulse, between the gate and the source a second threshold pulse representative of another limit of the target threshold range; and (c) means for ascertaining whether the device is on or off in response to each of the first and the second threshold pulse.

Another aspect of the invention concerns a method of initializing the field-effect semiconductor device of above summarized construction for operation in normally-off mode. A preferred example of this method comprises applying between the gate and the source one, two or more initializer pulses until a sufficient amount of carriers becomes stored in the carrier storage. Whether the carrier storage has been sufficiently carrier enriched is checked after application of each initializer pulse in terms of whether the threshold of the device has fallen in the noted target range. The foregoing cycle of initializer pulse application and threshold check is repeated until the device becomes properly initialized. The whole process of initialization is preprogrammed and automated.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

The invention will now be described more specifically as embodied in the HEMT-type field-effect semiconductor device shown in FIG. 1 of the drawings. The "HEMT-type field effect semiconductor device" is so named tentatively in this specification because its construction differs in some significant respect from that of what is now known as the HEMT, but as a whole is akin thereto. So the device shown in FIG. 1, as well as the additional devices shown in FIGS. 4-6, will be referred to as the "HEMT-type field-effect semiconductor device," or simply as "HEMT-type semiconductor device," or more simply as "HEMT-type device," or even more simply as "device." How the illustrated devices differ from the conventional HEMT will be explained later where such explanation will be best understood.

Figure 1:
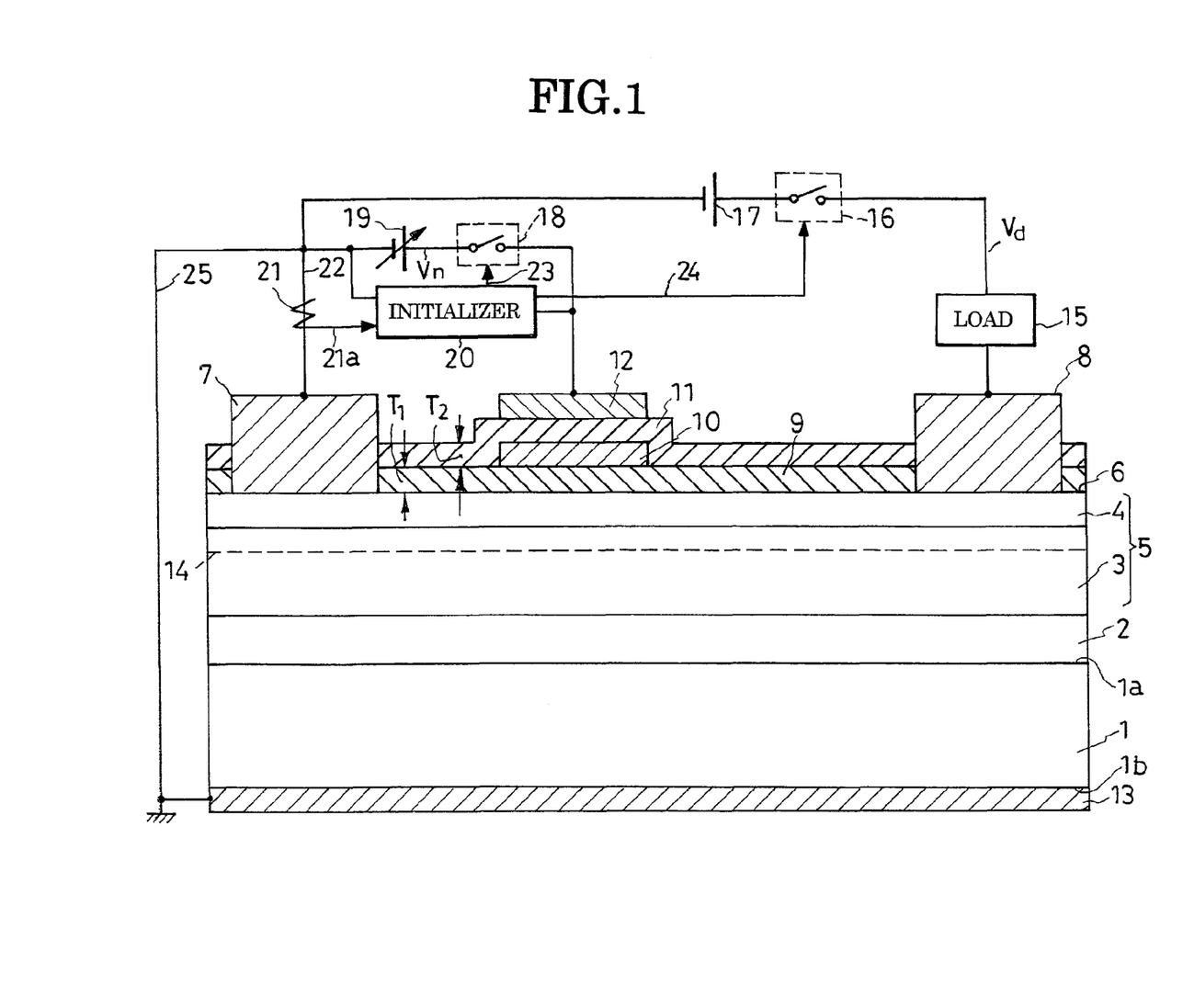
FIG. 1 is a schematic sectional view of a HEMT-type field-effect semiconductor device built on the novel principles of the present invention, shown together with a schematic diagram of associated initialization and power supply circuitry.

The HEMT-type field-effect semiconductor device of FIG. 1 comprises a flat substrate 1 of semiconducting monocrystalline silicon having a pair of opposite major surfaces $1_a$ and $1_b$. Grown on the major surface $1_a$ of the substrate 1 via a buffer region 2 is a main semiconductor region 5 which is shown constituted of an electron transit layer 3 and an electron supply layer 4 according to the conventional HEMT configuration. A source or source electrode 7 and a drain or drain electrode 8 are formed in selected positions on the major surface 6 of the main semiconductor region 5, or of the electron supply layer 4. Constituting a feature of this invention, a carrier storage layer 10 overlies the major surface 6 of the main semiconductor region 5 via a first insulating film 9 which covers all the major surface 6 but its parts underlying the source 7 and drain 8. A gate or gate electrode 12, another standard HEMT component, overlies the carrier storage layer 10 via a second insulating film 11. A back electrode 13 underlies the major surface $1_b$ of the substrate 1.

The substrate 1 serves as both a basis for epitaxially growing the main semiconductor region 5 thereon and a mechanical support for all the overlying parts. The substrate is made from silicon for economy in this particular embodiment.

The buffer region 2 may be grown in vapor phase on the substrate 1 by any known or suitable method such as metalorganic chemical vapor deposition (MOCVD) also known as metalorganic vapor phase epitaxy (MOVPE). In practice the buffer region 2 may be either mono- or multi-layered. The multilayer option may comprise, for example, a desired number of alternations of an AlN layer and a GaN layer. Other Groups III-V compound semiconductor materials are adoptable. Being not too closely associated with the operation of the HEMT-type field-effect semiconductor device, however, the buffer region 2 is eliminable.

Directly overlying the buffer region 2 is the electron transit layer 3 which is made from undoped GaN to a thickness of 1-3 micrometers in this particular embodiment. As indicated by the broken line labeled 14, the electron transit layer 3 provides, in cooperation with the overlying electron supply layer 4 yet to be detailed, what is known in the art as a two-dimensional electron gas layer as the channel parallel to the major surface 6 of the main semiconductor region 5. Groups III-V compound semiconductors other than GaN may be used for the electron transit layer 3.

Grown on the electron transit layer 3, the electron supply layer 4 is made from any of the nitride semiconductors that are generally expressed by the formula:

$Al_xGa_{1-x}N$ where the subscript x is a numeral that is greater than zero and less than one, preferably in the range of 0.2 through 0.4, and most desirably 0.3. Although made from undoped AlGaN, the electron supply layer 4 behaves n-like in the completed device. Alternately, the electron supply layer 4 may be made from n-doped AlGaN or from other III-V compound semiconductors.

The electron supply layer 4 is approximately 5-50 nanometers, preferably 20 nanometers, thick and so is thinner than the electron transit layer 3, so much so that its electric resistance is negligibly small in its thickness direction compared to that in its transverse direction (parallel to the major surface 6). It is understood that the major surface 6 of the electron supply layer is flat, with no special treatment applied in this embodiment.

The electron supply layer 4 and the underlying electron transit layer 3 provide a heterojunction therebetween, being different in both bandgap and lattice constant. The electron supply layer 4 is greater in bandgap than the electron transit layer 3, and less in lattice constant than the electron transit layer 3. Piezoelectric depolarization at this heterojunction creates the aforesaid two-dimensional electron gas layer 14 internally of the electron transit layer 3. The two-dimensional electron gas layer 14 indicated in FIG. 1 presupposes conduction between source 7 and drain 8.

Formed with a prescribed spacing from each other on the major surface 6 of the main semiconductor region 5, the source 7 and drain 8 both make low-resistance contact with the electron supply layer 4. These electrodes 7 and 8 may both be laminations of titanium and aluminum layers.

The first insulating film 9, directly overlying the major surface 6 of the main semiconductor region 5, has a thickness $T_1$ in the range of 1-100 nanometers, preferably 8-100 nanometers. With its thickness $T_1$ so determined, the first insulating film 9 offers the tunnel effect whereby:

1. In carrier storage mode, the so-called hot electrons (carriers) that have jumped out of the two-dimensional electron gas layer 14 are allowed through the first insulating film 9 for storage in the carrier storage layer 10.
2. In carrier release mode, the carriers from the carrier storage layer 10 are allowed back through the first insulating film 9 into the main semiconductor region 5.

Such bidirectional tunneling of the carriers through the first insulating film 9 takes place in response to the application of voltage pulses between source 7 and gate 12, as will be detailed later. Preferably, the thickness $T_1$ of the first insulating film 9 should be less than the thickness $T_2$ of the second insulating film 11. The first insulating film 9 may be made from silicon oxide, as in the form of oxidized polycrystalline silicon (polysilicon), by chemical vapor deposition (CVD). Despite the showing of FIG. 1, being intended to electrically disconnect the main semiconductor region 5 and the carrier storage layer 10 from each other, the first insulating film 9 need not overlie the entire exposed part of the major surface 6 but may be interposed only between main semiconductor region 5 and carrier storage layer 10.

The carrier storage layer 10 overlies the first insulating film 9 in a position spaced from both source 7 and drain 8. The carrier storage layer 10 is made from a material, such for example as electroconductive polysilicon, that can accept and store a sufficient amount of carriers for holding this HEMT-type device normally off. Being electrically disconnected from all of external circuitry, source 7, drain 8 and gate 12, the carrier storage layer 10 might also be called a floating gate. The carrier storage layer 10 when initialized in a manner yet to be described stores enough carriers for holding the source 7 and drain 8 normally disconnected from each other. Possible alternative materials for the carrier storage layer 10 include metal and crystalline semiconductors and organic semiconductors.

Thoroughly covering the carrier storage layer 10 is the second insulating film 11 which, like the first insulating film 9, is made from silicon oxide by CVD. The carriage storage layer 10 is thus thoroughly embedded between the two insulating films 9 and 11. The second insulating film 11 has a thickness $T_2$ in the range of 8-200 nanometers and is preferably thicker than the first insulating film 9. However, the insulating films 9 and 11 and carrier storage layer 10 should altogether be sufficiently thin to permit the control of the main semiconductor region 5 by the overlying gate 12 in a conventional manner. Again despite the showing of FIG. 1 the second insulating film 11 need not cover the entire first insulating film 9 but may cover only the carrier storage layer 10.

The gate 12 overlies the carrier storage layer 10 via the second insulating film 11 and is made from metal such as aluminum. The carrier storage layer 10 and gate 23 need not be of the same size or in exact register with each other as shown but may differ in size or be in partial register. The gate 12 is utilized for carrier-enriching the carrier storage layer 10 at the time of device initialization according to the invention, besides being conventionally used for controlling the operation of this HEMT-type semiconductor device after initialization.

It is now seen that this "HEMT-type field-effect semiconductor device" differs from the conventional HEMT in that the gate 12 is not in direct Schottky contact with the electron supply layer 4. The HEMT-type device is nevertheless so called because it utilizes the two-dimensional electron gas layer 14 as the channel.

The HEMT-type device is shown in FIG. 1 in combination with associated power supply and initializer circuitry in order to facilitate the subsequent discussion of how the device is initialized for normally-off operation. A DC power supply 17 is connected between source 7 and drain 8 via a load 15 and drain power switch 16. A gate drive power supply 19 is connected between source 7 and gate 12 via a gate control switch 18. Also connected between source 7 and gate 12 is an initializer circuit 20 which applies to the gate both initializer pulses for carrier enrichment of the carrier storage layer 10 and threshold pulses for checking if a sufficient amount has been stored in the carrier storage layer in response to each initializer pulse. The initializer circuit 20 is diagramed in detail in FIG. 2, to which reference will be had presently.

In order to aid the initializer circuit 20 in initializing the device, a current detector 21 is connected by way of a conductor $21_a$ to an input of the initializer circuit. Electromagnetically coupled to another conductor 22 which is connected directly to the source 7, the current detector 21 is intended to inform the initializer circuit 20 that a source current has started to flow and hence that the device is turning on. The initializer circuit 20 has an output conductor 23 for on/off control of the gate control switch 18 and another output conductor 24 for on/off control of the drain power switch 16. The source 7 is connected to the back electrode 13 and grounded via a conductor 25.

Figure 2:
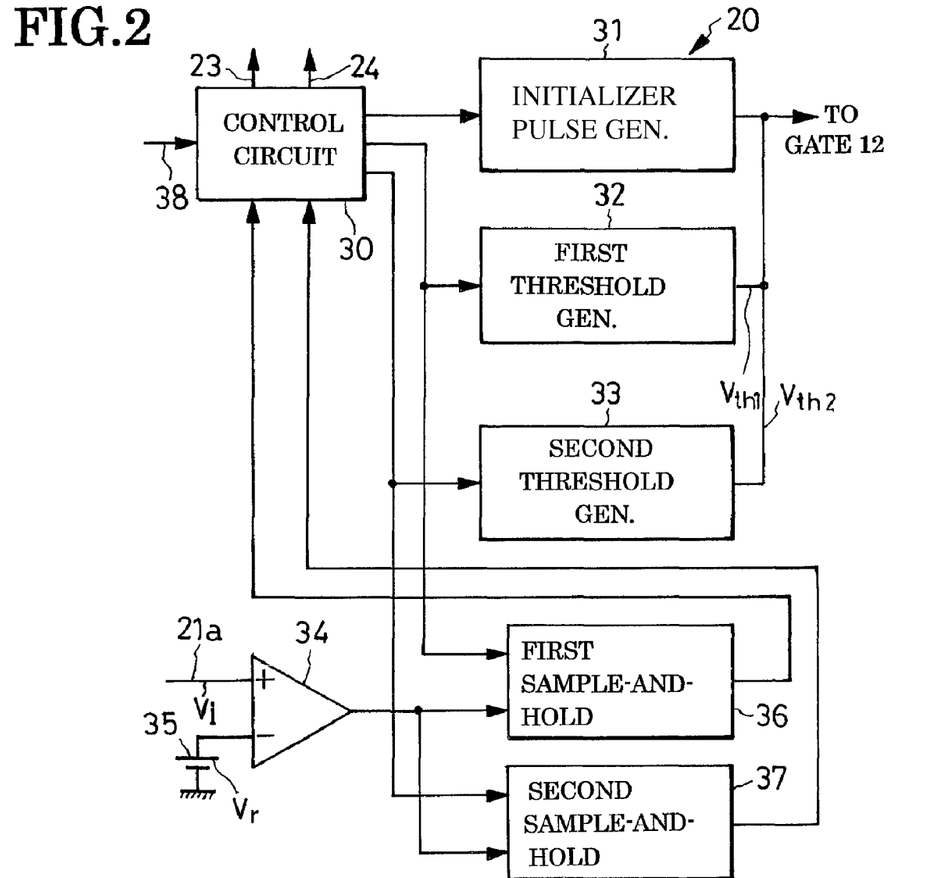
FIG. 2 is a block diagram showing in more detail the initializer circuit included in the electric circuitry of FIG. 1.

Reference may now be had to FIG. 2 for a more detailed study of the initializer circuit 20. The initializer circuit 20 performs the following functions according to a prescribed initialization program or subroutine:

1. Applying an initializer pulse or voltage between source 7 and gate 12 for causing carriers to be stored in the carrier storage layer 10.

2. Checking the threshold voltage of the device after each initializer pulse.

3. Finding if the threshold measurement is in a prescribed target range.

4. Readjusting, as necessary, the threshold of the device so as to make it fall within the target range by cyclic repetition of the foregoing three steps.

For the execution of the initialization program the initializer circuit 20 comprises a control circuit 30 having a first output connected to an initializer pulse generator 31, a second output connected to both first threshold generator 32 and first sample-and-hold circuit 36, a third output connected to both second threshold generator 33 and second sample-and-hold circuit 37, a fourth output connected by way of the conductor 23 to the gate control switch 18, FIG. 1, and a fifth output connected by way of the conductor 24 to the drain power switch 16. Also included is a comparator 34 which has one input connected to the current detector 21, FIG. 1, via the conductor $21_a$, another input connected to a reference voltage source 35, an output connected to both first and second sample-and-hold circuits 36 and 37. The outputs of the initializer pulse generator 31, first threshold generator 32 and second threshold generator 33 are all connected to the gate 12. The outputs of the first and second sample-and-hold circuits 36 and 37 are both connected to the control circuit 30.

Figure 3:
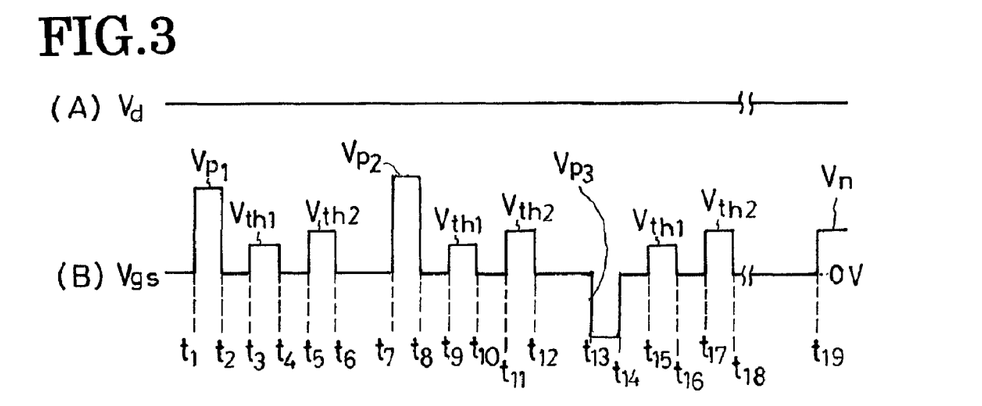
FIG. 3, consisting of (A) and (B), is a diagram of waveforms useful in explaining how the HEMT-type device of FIG. 1 is initialized by the method of this invention.

The ensuing operational description of the initializer circuit will be better understood by referring also to the waveform diagram of FIG. 3. The initializer pulse generator 31 operates under the direction of the control circuit 30, generating, during the period of initialization, initializer pulses $V_{p1}$, $V_{p2}$ and $V_{p3}$ each having an amplitude greater than the peak amplitude of the normal gate-source voltage $V_n$ when the device is on. It is understood that the initializer pulse generator 31 is capable of generating pulses of variable amplitude and, additionally, both positive pulses such as those designated $V_{p1}$ and $V_{p2}$ at (B) in FIG. 3 and negative pulses such as that labeled $V_{p3}$ in the same figure.

Referring more specifically to FIG. 3, the normally-off HEMT-type device is therein shown as being initialized from $t_1$ to $t_{18}$ according to the initialization program and starting normal operation at $t_{19}$. As indicated at (A) in this figure, the voltage $V_d$ of constant magnitude is applied between source 7 and drain 8 from the power supply 17 via the load 15 throughout the periods of initialization and normal operation. At (B) are depicted the initializer pulses $V_{p1}$, $V_{p2}$ and $V_{p3}$ from the initializer pulse generator 31, the threshold pulses $V_{th1}$ and $V_{th2}$ from the threshold generators 32 and 33, and the gate control signal $V_n$ during normal operation after $t_{19}$.

Kinetic energy will be imparted to the electrons traveling through the two-dimensional electron gas layer 14 from source 7 to drain 18 upon application of the initializer pulses $V_{p1}$ and $V_{p2}$, as from $t_1$ to $t_2$ and from $t_7$ to $t_8$ in FIG. 3, between source 7 and gate 12. These initializer pulses $V_{p1}$ and $V_{p2}$ are greater in amplitude as aforesaid than the gate control signal $V_n$ to be applied to the gate 12 during the normal operation of the device after $t_{19}$. The energized electrons will accelerate to a degree that will grow higher from the source-side extremity of the gate 12 toward its drain-side extremity. Both electrons and holes will be generated upon collision of the accelerating electrons with the atoms in the main semiconductor region 5, FIG. 1, of the HEMT-type device. The high energy electrons thus generated, or hot electrons, will come jumping out from the two-dimensional electron gas layer 14, and some of them will tunnel through the electron supply layer 4 and first insulating film 9, ultimately to be stored in the carrier storage layer 10.

Another explanation is possible for such compulsory electron enrichment of the carrier storage layer 10: The high potential of the gate 12 draws the electrons from the two-dimensional electron gas layer 14 toward the carrier storage layer 10. Then, traversing the first insulating film 9 by the tunnel effect, the electrons arrive at the carrier storage layer 10.

Although the second initializer pulse $V_{p2}$ is shown to be of greater amplitude than the first $V_{p1}$ at (B) in FIG. 3, this difference is not an absolute requirement. The initializer pulses $V_{p1}$ and $V_{p2}$ may instead be of the same amplitude.

The electrons that have been stored in the carrier storage layer 10 will mostly stay entrapped therein as long as the relatively low amplitude gate control voltage $V_n$ is being applied between source 7 and gate 12 for turning the device on during normal operation. The electron-impregnated carrier storage layer 10 will create a depletion layer in the electron transit layer 3 just as the gate 12 does when biased with a negative voltage. Therefore, when the gate 12 is unbiased in the normal operation of the device, the depletion layer 3 will appear in the electron transit layer 3 and interrupt electron flow between source 7 and drain 8. Thus will the HEMT-type device operate normally off.

The initialization of the device will come to an end if a sufficient amount of electrons is stored in the carrier storage layer 10 in response to the first initializer pulse $V_{p1}$. In practice, however, a sufficient amount of electrons may, or may not, be stored in the carrier storage layer 10 by application of one or more initializer pulses. It is therefore necessary to examine whether electrons have been sufficiently stored in the carrier storage layer 10 upon application of each initializer pulse. Toward this end the actual threshold of the device is checked after each initializer pulse to see if it is in the target range. A sufficient amount of electrons has been stored in the carrier storage layer 10 if the threshold of the device is in the target range.

As indicated at (B) in FIG. 3, the first threshold generator 32 of the initializer circuit 20 delivers to the gate 12 a first threshold pulse $V_{th1}$ after each of the initializer pulses $V_{p1}$, $V_{p2}$ and $V_{p3}$ under the direction of the control circuit 30. The first threshold pulses $V_{th1}$ are shown applied from $t_3$ to $t_4$, from $t_9$ to $t_{10}$, and from $t_{15}$ to $t_{16}$. These first threshold pulses must of course be appropriately less in amplitude than the positive initializer pulses. The second threshold generator 33 delivers to the gate 12 a second threshold pulse $V_{th2}$ after each first threshold pulse $V_{th1}$ under the direction of the control circuit 30, as from $t_5$ to $t_6$, from $t_{11}$ to $t_{12}$, and from $t_{17}$ to $t_{18}$. The second threshold pulses $V_{th2}$ are less than the initializer pulses, but greater than the first threshold pulses, in amplitude.

The first and the second threshold pulses $V_{th1}$ and $V_{th2}$ represent the lower and upper limits, respectively, of the target range in which the threshold of the completed HEMT-type device is required to fall. The amount of carriers to be stored in the carrier storage layer 10 of the HEMT-type device is adjusted to keep its threshold between the values of the two threshold pulses $V_{th1}$ and $V_{th2}$, thereby minimizing variations in the threshold value of all the actual products manufactured according to the present invention. Therefore, upon completion of initialization now being discussed, the HEMT-type device is conditioned for operation with its threshold between $V_{th1}$ and $V_{th2}$.

Referring back to FIG. 2, the comparator 34 of the initializer circuit 20 has one input connected to the current detector 21, FIG. 1, by way of the conductor $21_a$ and another input connected to the reference voltage source 35. The reference voltage $V_r$ from this source 35 is equal to the voltage of the source (or drain) current at the beginning of each conducting period of the HEMT-type device. Consequently, during the conducting periods of the device, the current detect signal $V_i$ over the conductor $21_a$ is higher than the reference voltage $V_r$. The comparator 34 will then go high, signifying that the device is on. The comparator 34 is low when the device is off because then the current detect signal $V_i$ is less than the reference voltage $V_r$.

Commanded by the control circuit 30, the first sample-and-hold circuit 36 samples the output from the comparator 34 during, preferably the latter halves of, the periods of $t_3$-$t_4$, $t_9$-$t_{10}$ and $t_{15}$-$t_{16}$ in FIG. 3. The first sample-and-hold circuit 36 holds the comparator output samples and delivers them to the control circuit 30. The second sample-and-hold circuit 37 likewise operates as dictated by the control circuit 30 to sample the output from the comparator 34 during, preferably the latter halves of, the periods of $t_5$-$t_6$, $t_{11}$-$t_{12}$ and $t_{17}$-$t_{18}$. This second set of comparator output samples are also held in the second sample-and-hold circuit 37 and delivered therefrom to the control circuit 30. The samples that have been held in the sample-and-hold circuits 36 and 37 are deleted before the next samplings or before holding of the next samples.

Besides being connected to the initializer pulse generator 31, threshold generators 32 and 33, sample-and-hold circuits 36 and 37 of the initializer circuit 20, the control circuit 30 is connected to the drain power switch 16, gate control switch 18 in FIG. 1, for implementation of the initialization program outlined earlier in this specification. First, in response to a call of initialization coming from its unshown source over the conductor 38, the control circuit 30 turns the drain power switch 16 on thereby causing the voltage $V_d$, FIG. 3 (A), to be applied between source 7 and drain 8 via the load 15. Further the control circuit 30 causes the initializer pulse generator 31 to generate the first initializer pulse $V_{p1}$ from $t_1$ to $t_2$ in FIG. 3. Applied between source 7 and gate 12, the first initializer pulse $V_{p1}$ will cause electrons to be stored in the carrier storage layer 10, either sufficiently or insufficiently.

Then, from $t_3$ to $t_4$, the control circuit 30 causes the first threshold generator 32 to put out the first threshold pulse $V_{th1}$ in the case, represented by FIG. 3, where a sufficient amount of electrons has not been stored in the carrier storage layer 10 by the application of the first initializer pulse $V_{p1}$. The device will turn on upon application of the first threshold pulse $V_{th1}$ to the gate 12. Thereupon the comparator 34 will go high, indicating that the device is on. The control circuit 30 causes the first sample-and-hold circuit 36 to sample and hold the output from the comparator 34 and further inputs from the first sample-and-hold circuit a signal indicative of the conduction of the device.

Then the control circuit 30 causes the second threshold generator 33 to put out the second threshold pulse $V_{th2}$ from $t_5$ to $t_6$ for application to the gate 12. In the case represented by FIG. 3, the device remains on after application of the second threshold pulse $V_{th2}$, as on application of the first threshold pulse $V_{th1}$ from $t_3$ to $t_4$, so that the comparator 34 will remain high. During this $t_5$-$t_6$ period or its second half or at its last moment $t_6$ the control circuit 30 causes the second sample-and-hold circuit 37 to sample and hold the output from the comparator 34 and again inputs from the second sample-and-hold circuit a signal indicating that the device is on. Incidentally, the illustrated two threshold pulses $V_{th1}$ and $V_{th2}$ of different amplitudes are reversible in sequence.

The control circuit 30 proceeds to determine whether the device has its threshold within the target range. Relied upon to this end are the output from the first sample-and-hold circuit 36 during the $t_3$-$t_4$ period and the output from the second sample-and-hold circuit 37 during the $t_5$-$t_6$ period. It is assumed that these outputs both indicate that the device is on, meaning that the threshold of the device falls short of the target range; in other words, that electrons are insufficiently stored in the carrier storage layer 10.

Given these findings, the control circuit 30 causes the initializer pulse generator 31 to put out the second initializer pulse $V_{p2}$, which has an amplitude not less than that of the first initializer pulse $V_{p1}$, from $t_7$ to $t_8$. Further, for rechecking the threshold of the device, the control circuit 30 proceeds to cause the threshold generators 32 and 33 to put out another first threshold pulses $V_{th1}$ from $t_9$ to $t_{10}$ and another second threshold pulse $V_{th2}$ from $t_{11}$ to $t_{12}$. If the first sample-and-hold circuit 36 indicates upon application of the first threshold pulse $V_{th1}$ to the gate 12 from $t_9$ to $t_{10}$ that the device is off, and the second sample-and-hold circuit 37 indicates upon application of the second threshold pulse $V_{th2}$ from $t_{11}$ to $t_{12}$ that the device is on, then the control circuit determines that the threshold of the device has now fallen within the target range and that sufficient electrons have been stored in the carrier storage layer 10. Then the initialization program is finished.

Possibly, however, the first sample-and-hold circuit 36 might indicate upon application of the first threshold pulse $V_{th1}$ from $t_9$ to $t_{10}$ that the device was on, and the second sample-and-hold circuit 37 might also indicate upon application of the second threshold pulse $V_{th2}$ from $t_{11}$ to $t_{12}$ that the device was on. The threshold of the device would still be less than the target range in that case. Then the control circuit 30 would cause the initializer pulse generator 31 to impress to the gate 12 a third positive initializer pulse, not shown, having an amplitude not less than that of the second initializer pulse $V_{p2}$. Then the threshold of the device would again be rechecked as after the second initializer pulse $V_{p2}$.

The two sample-and-hold circuits 36 and 37 may both show that the device is off upon application of the threshold pulses $V_{th1}$ and $V_{th2}$ from $t_9$ to $t_{10}$ and from $t_{11}$ to $t_{12}$, as in the case represented by FIG. 3. These results mean that more than a sufficient amount of electrons has been stored in the carrier storage layer 10, making it impossible to turn the device on in the target threshold range. Then a negative initializer pulse $V_{p3}$ is applied to the gate 12, as from $t_{13}$ to $t_{14}$ in FIG. 3, in order that the carrier storage layer 10 may be relieved of excess electrons. The absolute value of the amplitude of this negative initializer pulse $V_{p3}$ is higher than the amplitude of the gate control signal $V_n$ during the normal operation of the device, as are the amplitudes of the positive initializer pulses $V_{p1}$ and $V_{p2}$.

FIG. 3 shows that the voltage $V_d$ is applied between source 7 and drain 8 via the load 15 during the $t_{13}$-$t_{14}$ period when the negative initializer pulse $V_{p3}$ is being applied to the gate 12. Alternatively, however, the drain 8 might be held at a potential less than the voltage $V_d$, for example at the same potential as the source 7.

Upon application of the negative initializer pulse $V_{p3}$ to the gate 12 as above, some of the electrons that have been stored in the carrier storage layer 10 will be released therefrom and, tunneling back through the first insulating film 9, discharged into the main semiconductor region 5. Then the threshold of the device is rechecked again by the application of one other first threshold pulse from $t_{15}$ to $t_{16}$ and one other second threshold pulse from $t_{17}$ to $t_{18}$. The threshold is in the target range if the first sample-and-hold circuit indicates that the device is off, and the second sample-and-hold circuit that the device is on. Then the initialization programs comes to an end. If the threshold is still not in the target range, then the procedure of either $t_{13}$-$t_{18}$ or $t_1$-$t_{18}$ is repeated.

The desired normally-off HEMT-type device is obtained upon completion of initialization as at $t_{18}$ FIG. 3, with its threshold readjusted to the target range. It may be put to immediate use by turning on the gate power switch 18 on at $t_{18}$. Then at $t_{19}$ is shown the gate control signal $V_n$ applied to the gate 12 for turning the device on. It is understood that the amplitude of the gate control signal $V_n$ is higher than the threshold of the device that has been initialized as above, and less than the amplitudes of the positive initializer pulses $V_{p1}$ and $V_{p2}$. The threshold of the initialized device is intermediate as aforesaid between the amplitudes of the threshold pulses $V_{th1}$ and $V_{th2}$. The application of the turn-on gate control signal $V_n$ to the gate of the device results in the cancellation of the field due to the electrons that have been stored in the carrier storage layer 10. Thus the two-dimensional electron gas layer 14, which has been held nonconducting by the electrons in the carrier storage layer 10, becomes conducting. The result is the completion of the electron path through the source 7, electron supply layer 4, two-dimensional electron gas layer 14, electron supply layer 4, and drain 8.

The device may be turned off by application of a turn-off gate control signal to the gate 12. The turn-off gate control signal may be either zero or less than the threshold of the initialized device, as from $t_{18}$ to $t_{19}$ in FIG. 3.

This HEMT-type device lends itself to use as a switch. The gate power switch 18 may then take the form of a solid-state switch, and this switch may be turned on and off for on/off control of the device. The magnitude of the drain current is variable by changing the voltage offered by the gate voltage source 19.

The carriers that have been stored in the carrier storage layer 10 will stay there so long that the initializer circuit 20 is removable upon completion of initialization. However, the initializer circuit 20 may be made a permanent appendage of the HEMT-type device if its intended applications require or warrant repeated initializations of the device.

The advantages gained by the above described embodiment of the invention may be recapitulated as follows:

1. The normally-off performance of the device is obtained by the addition of the carrier storage layer 10, with the electron supply layer 4 kept relatively thick and with the electron supply layer made from AlGaN containing a relatively high proportion of aluminum. Consequently, despite being normally off, the device has the two-dimensional electron gas layer 2 of such high electron concentration that its on-resistance is comparatively low.

2. For initialization, carriers are readily stored in the carrier storage layer 10 merely by application of initializer pulses which are somewhat higher in amplitude than the gate control signal.

3. The threshold of the device is easily readjustable to the target range, namely, by applying one initializer pulse $V_{p1}$, then by checking the threshold, then, if necessary, by applying either or both of the initializer pulses $V_{p2}$ and $V_{p3}$ of opposite polarities, and then by rechecking the threshold.

4. The device is easily mass-producible with little or no fluctuations in threshold, either when a plurality of devices are fabricated in and on a common substrate, when a plurality of discrete units are made, or when a multiplicity of devices are formed in and on a common wafer for subsequent dicing.

Figure 4:
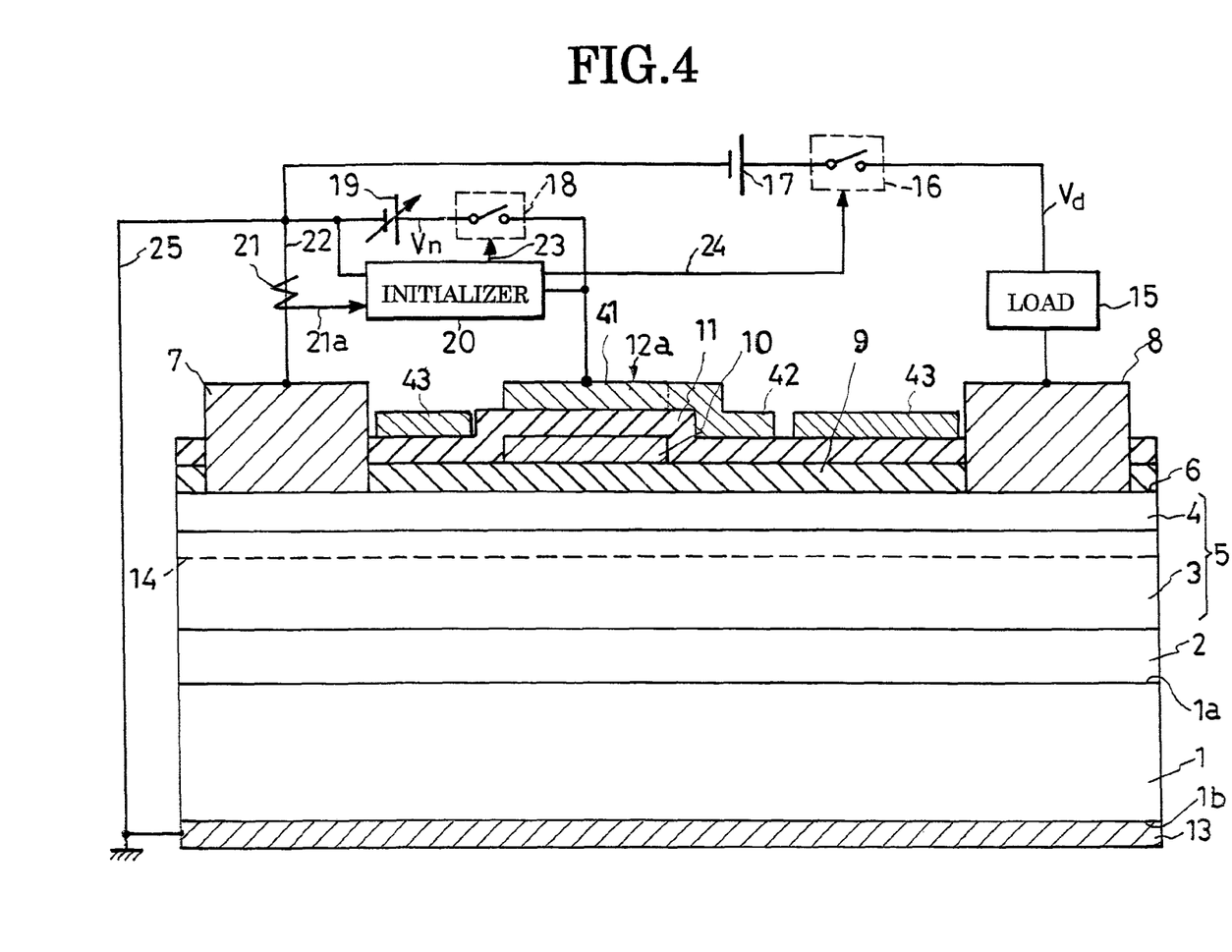
FIG. 4 is a view similar to FIG. 1 but showing another preferred form of HEMT-type device embodying the invention.

Embodiment of FIG. 4

This embodiment features a gate unit $12_a$, a one-piece combination of a gate proper 41 and a field plate 42. Like the gate 12 of the FIG. 1 embodiment the gate proper 41 overlies the carrier storage layer 10 via the second insulating film 11. The field plate 42 extends from the gate proper 41 toward, and terminates short of, the drain 1. Held against the major surface 6 of the main semiconductor region 5 via the two insulating films 9 and 11, the field plate 42 contributes toward enhancement of the voltage strength of the device by virtue of the known field plate effect.

Another feature of this embodiment resides in n-type organic semiconductor films 43 which are both held against the major surface 6 of the main semiconductor region 5 via the insulating films 9 and 11. The organic semiconductor films 43 coact with the n-like electron supply layer 4 to increase the electron concentration of the two-dimensional electron gas layer 14. The organic semiconductor films 23 are made for example from fullerenes (notably $C_{60}$ and $C_{70}$) or from copper or other metal phthalocyanine, to a thickness of 200 nanometers or so.

This FIG. 4 embodiment is identical in all the other details of construction with that of FIG. 1. It is therefore apparent that this embodiment possesses all the advantages of the first disclosed embodiment set forth in conjunction with FIGS. 1-3.

Figure 5:
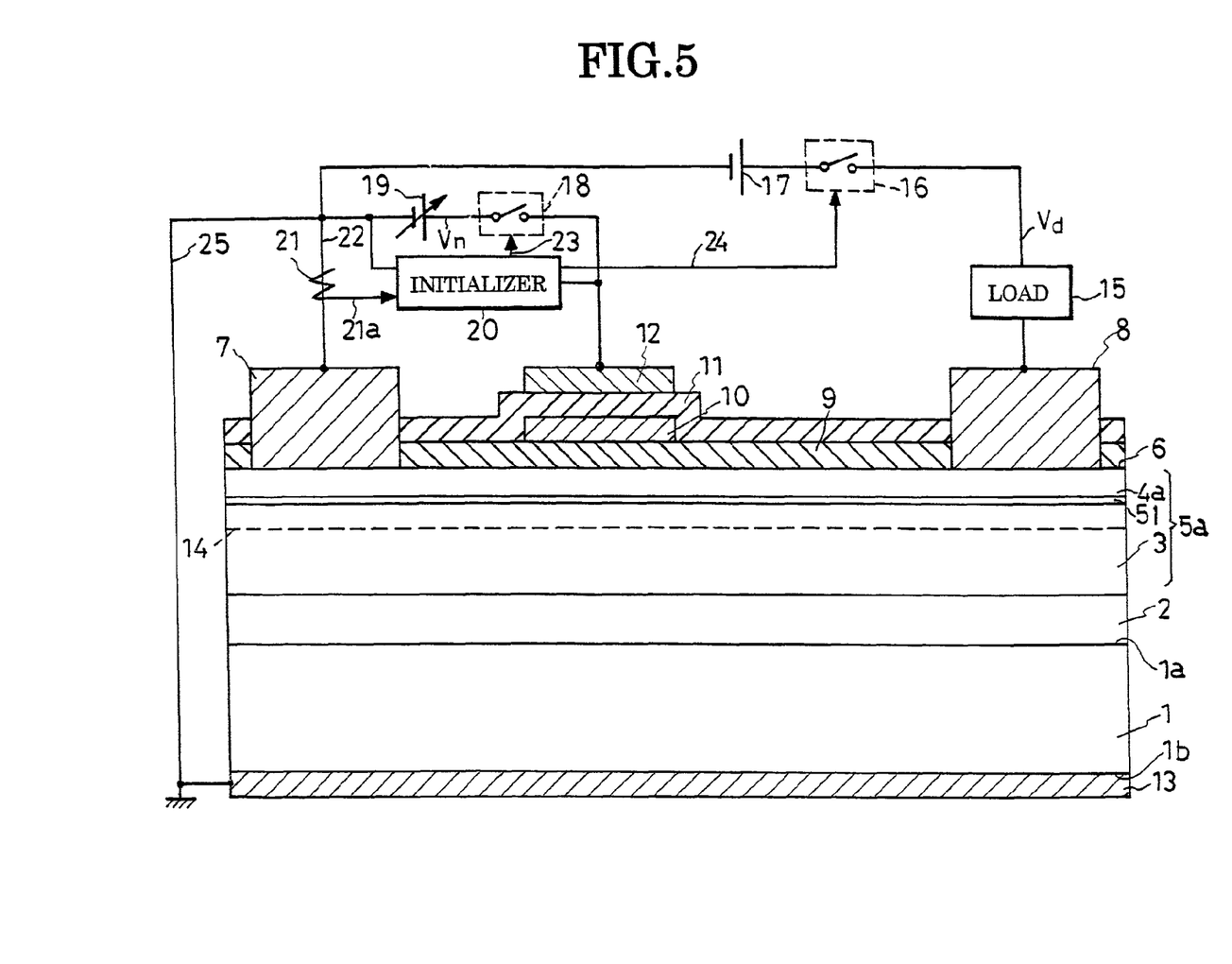
FIG. 5 is also a view similar to FIG. 1 but showing still another preferred form of HEMT-type device embodying the invention

Embodiment of FIG. 5

The HEMT-type device shown here is of the same construction as that of FIG. 1 except for its main semiconductor region $5_a$. The main semiconductor region $5_a$ is a lamination of the electron transit layer 3 of the same make as its FIG. 1 counterpart, a spacer layer 51 of undoped AlGaN, and an n-doped electron supply layer $4_a$. The electron supply layer $4_a$ differs from its FIG. 1 counterpart 4 in that the former is n-doped whereas the latter is undoped and n-like. Formed to a thickness of about 2-5 nanometers between electron transit layer 3 and electron supply layer $4_a$, the spacer layer 51 serves to block impurity diffusion from electron supply layer into electron transit layer. The spacer layer 51 could be made from other III-V compound semiconductors such as AlN.

Incorporating the carrier storage layer 10 under the gate 12 together with the associated initializer circuitry, this FIG. 5 embodiment gains the same benefits as does that of FIG. 1. The teachings of this embodiment are applicable to the foregoing embodiments.

Figure 6:
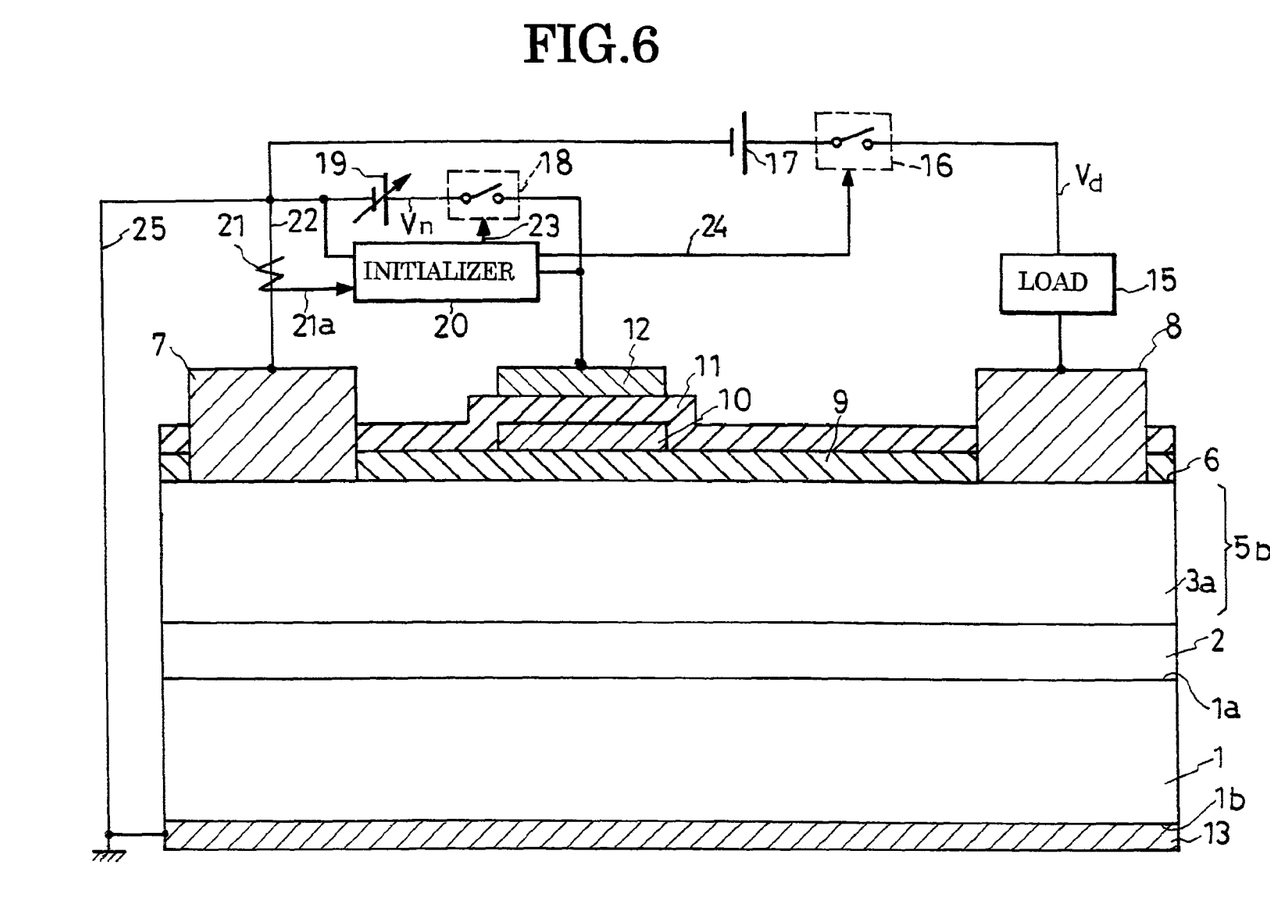
FIG. 6 is also a view similar to FIG. 1 but showing a MESFET-type field-effect semiconductor device embodying the invention.

Embodiment of FIG. 6

This embodiment represents an application of this invention to a MESFET or MESFET-type field-effect semiconductor device. What has been said about similarities and dissimilarities between the conventional HEMT and the inventive HEMT-type device at the beginning of this detailed description largely applies here. The conventional MESFET has its gate in Schottky contact with the main semiconductor region. The conventional insulated-gate field-effect transistor, too, has its gate directly laid over the main semiconductor region via a gate insulator. The device shown in FIG. 6 differs in its gate placement from the conventional MESFET and IGFET but closely resembles the MESFET in all other respects. The FIG. 6 device will therefore be referred to as the MESFET-type field-effect semiconductor device or simply as the MESFET-type device.

The MESFET-type field-effect semiconductor device differs from the HEMT-type device of FIG. 1 only in its main semiconductor region $5_b$, which is comprised of only a channel or active layer $3_a$ of silicon-doped n-type GaN. The channel layer $3_a$ directly overlies the buffer layer 2 and is itself overlain by the source 7 and drain 8 in ohmic contact therewith. The carrier storage layer 10, gate 12, and insulating films 9 and 11 are arranged on the major surface 6 of the main semiconductor region $5_b$ as in the FIG. 1 embodiment.

The MESFET of conventional make, which is similar to this MESFET-type device except for the carrier storage layer 10, operates in normally-on mode. By incorporating the carrier storage layer 10, the MESFET-type device of FIG. 6 operates normally off as the electron-enriched carrier storage layer creates a depletion layer in the channel layer $3_a$ to block current flow between source 7 and drain 8. How the electrons are introduced into the carrier storage layer 10 is as described above in connection with the FIG. 1 embodiment. Additional advantages of this MESFET-type device are considered self-evident from the foregoing description of the HEMT-type devices.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative semiconductor devices which are all believed to fall within the purview of the claims annexed hereto:

1. A contact layer could be formed under the source 7 and drain 8 for better ohmic contact with the main semiconductor region 5, $5_a$ or $5_b$ in all the embodiments disclosed herein.

2. The constituent layers 3, $3_a$, 4 and $4_a$ may be made from III-V compound semiconductors other than GaN and AlGaN, such as InGaN, AlInGaN, AlN, InAlN, AlP, GaP, AlInP, GaInP, AlGaP, AlGaAs, GaAs, AlAs, InAs, InP, InN and GaAsP, or from II-VI compound semiconductors such as ZnO, or from other compound semiconductors.

3. The substrate 1 may be made from semiconductors or insulators other than silicon, such as SiC, sapphire, and ceramics.

4. A plurality of field-effect semiconductor devices according to the invention, either HEMT- or MESFET-type, may be fabricated on a single substrate for provision of an inverter or converter circuit or the like.

5. The source 7 and drain 8 could be coupled directly to the electron transit layer 3, instead of to the electron supply layer 4.

6. The electron supply layer 4 could be removed, and there could be provided in its stead an ohmic contact layer, as of an n-type semiconductor, through which the source 7 and drain 8 might be connected to the electron transit layer 3.

7. The electron supply layer 6 is replaceable by a hole supply layer of a p-type semiconductor in the HEMT-type devices of FIGS. 1, 4 and 5. The n-doped GaN channel layer $3_a$ of the MESFET-type device of FIG. 6 is likewise replaceable by a p-type semiconductor layer. A two-dimensional hole gas will then be created in what is termed the two-dimensional electron gas layer in the illustrated embodiments, and holes will be drawn into the carrier storage layer on initialization.

8. Whether a desired amount of carriers has been stored in the carrier storage layer 10 is ascertainable from a difference between the magnitudes of the current flowing through the source and drain, the current magnitudes being measurable using two current detectors. The carriers that are directed into the carrier storage layer 10 are those which issued from the source 7 but which did not arrive at the drain 8. The amount of the carriers that have issued from the source 7 minus that of the carriers that have arrived at the drain 8 is therefore equal to the amount of the carriers stored in the carrier storage layer 10. It is thus possible to monitor the amount of carriers being stored in the carrier storage layer 10 during the progress of initialization and terminate the initialization program upon storage of a sufficient amount of carriers.

9. The carrier storage layer 10 may be carrier enriched by a sustained application of a DC voltage to the gate 12, rather than by the intermittent application of the initializer pulses $V_{p1}$, $V_{p2}$, etc., as in the illustrated embodiment. The DC voltage should be of the mean value of the initializer pulses and higher than the turn-on gate control voltage $V_n$ in the normal operation of the device.

10. Another alternative method of carrier enrichment for the carrier storage layer 10 is to bombard the same with electrons or protons by the known ion implantation method for storage of electrons or holes.

What is claimed is:

1. A field-effect semiconductor device capable of normally-off operation, comprising:
   (a) a main semiconductor region having a major surface;
   (b) a source on the major surface of the main semiconductor region;
   (c) a drain on the major surface of the main semiconductor region spaced from the source;
   (d) a first insulating film on the major surface of the main semiconductor region and between the source and the drain;
   (e) a carrier storage layer on the first insulating film, the carrier storage layer being capable of accepting and storing electrons, the carrier storage layer being made from a conductive material selected from the group comprising electroconductive polysilicon, metal, crystalline semiconductor and organic semiconductor;
   (f) a second insulating film on the carrier storage layer;
   (g) a gate on the second insulating film; and
   (h) a field plate formed on the second insulating film positioned between the carrier storage layer and the drain, the field plate being electrically coupled to the gate,
   wherein the carrier storage layer has electrons stored therein to such an extent that the source and the drain are held electrically disconnected from each other even without application of a bias voltage to the gate
   wherein the main semiconductor region comprises
   an electron transit layer and
   an electron supply layer disposed on the electron transit layer for generating a two-dimensional electron gas layer as a channel between the source and the drain,
   wherein the electron transit layer and the electron supply layer are both made from compound semiconductors, and
   wherein the electron supply layer has a flat major surface.

2. A normally-off field-effect semiconductor device as defined in claim 1, wherein the main semiconductor region comprises a single semiconductor layer of a prescribed conductivity type.

3. A normally-off field-effect semiconductor device as defined in claim 2, wherein the semiconductor layer of the main semiconductor region is made from a compound semiconductor.

4. A normally-off field-effect semiconductor device as defined in claim 1, wherein the first insulating film comprises an insulating film having such a thickness that, upon application of a sufficient voltage to the gate to give rise to hot carriers in the main semiconductor region, the hot carriers are capable of tunneling through the insulating film.

5. A normally-off field-effect semiconductor device as defined in claim 1, further comprising initializer means for initializing the device by causing the carrier storage layer to store a sufficient amount of carriers for normally-off operation of the device.

6. A normally-off field-effect semiconductor device as defined in claim 5, wherein the initializer means comprises means for applying between the gate and the source an initializer voltage which is higher than a gate-source voltage to be applied therebetween in order to turn the device on in normal operation, thereby causing carriers to be stored in the carrier storage layer to such an extent that the source and the drain are held electrically disconnected from each other even without voltage application to the gate.

7. A normally-off field-effect semiconductor device as defined in claim 6, wherein the initializer means further comprises means for ascertaining, after application of the initializer voltage, whether the carrier storage layer has stored therein a sufficient amount of carriers to hold the source and the drain electrically disconnected from each other even without voltage application to the gate.

8. A normally-off field-effect semiconductor device as defined in claim 5, wherein the initializer means comprises:
  (a) an initializer pulse generator for applying between the gate and the source any required number of initializer pulses of greater amplitude than a gate voltage to be applied therebetween in order to turn the device on in normal operation and hence for causing carriers to be stored in the carrier storage layer; and
  (b) means for ascertaining, after application of each initializer pulse, whether the carrier storage layer has stored therein a sufficient amount of carriers to hold the source and the drain electrically disconnected from each other even without voltage application to the gate.

9. A normally-off field-effect semiconductor device as defined in claim 8, wherein the initializer pulse generator is capable of generating initializer pulses of variable amplitude and reversible polarity.

10. A normally-off field-effect semiconductor device as defined in claim 8, wherein the ascertaining means of the initializer means comprises:
  (a) a first threshold pulse generator for applying between the gate and the source a first threshold pulse representative of one limit of a target range in which the threshold of the device is desired to be;
  (b) a second threshold pulse generator for applying between the gate and the source a second threshold pulse representative of another limit of the target threshold range; and
  (c) means for ascertaining whether the device has turned on or off upon application each of the first and the second threshold pulse.

\* \* \* \* \*